United States Patent
Lu et al.

(10) Patent No.: US 7,211,144 B2
(45) Date of Patent: May 1, 2007

(54) PULSED NUCLEATION DEPOSITION OF TUNGSTEN LAYERS

(75) Inventors: Xinliang Lu, Sunnyvale, CA (US); Ping Jian, San Jose, CA (US); Jong Hyun Yoo, Milpitas, CA (US); Ken Kaung Lai, Milpitas, CA (US); Alfred W. Mak, Union City, CA (US); Robert L. Jackson, San Jose, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/194,629

(22) Filed: Jul. 12, 2002

(65) Prior Publication Data

US 2003/0127043 A1 Jul. 10, 2003

Related U.S. Application Data

(63) Continuation-in-part of application No. 10/023,125, filed on Dec. 17, 2001.

(60) Provisional application No. 60/305,307, filed on Jul. 13, 2001.

(51) Int. Cl.
  *C30B 25/16* (2006.01)
(52) U.S. Cl. ............ 117/101; 117/85; 117/86; 117/89; 117/102; 117/105
(58) Field of Classification Search ........... 117/101, 117/102, 105, 89, 85, 86
  See application file for complete search history.

(56) References Cited

U.S. PATENT DOCUMENTS 3,785,862 A  *  1/1974  Grill (Continued)

FOREIGN PATENT DOCUMENTS

DE        196 27 017          1/1997

(Continued)

OTHER PUBLICATIONS

Lee, et al., "Pulsed Nucleation for Ultra-High Aspect Ratio Tunsten Plugfill," Conference Proceedings ULSI XV111 (2002) Materials Research Society.

(Continued)

*Primary Examiner*—Robert Kunemund
(74) *Attorney, Agent, or Firm*—Patterson & Sheridan LLP

(57) ABSTRACT

A method of forming a tungsten nucleation layer using a sequential deposition process. The tungsten nucleation layer is formed by reacting pulses of a tungsten-containing precursor and a reducing gas in a process chamber to deposit tungsten on the substrate. Thereafter, reaction by-products generated from the tungsten deposition are removed from the process chamber. After the reaction by-products are removed from the process chamber, a flow of the reducing gas is provided to the process chamber to react with residual tungsten-containing precursor remaining therein. Such a deposition process forms tungsten nucleation layers having good step coverage. The sequential deposition process of reacting pulses of the tungsten-containing precursor and the reducing gas, removing reaction by-products, and than providing a flow of the reducing gas to the process chamber may be repeated until a desired thickness for the tungsten nucleation layer is formed.

25 Claims, 3 Drawing Sheets

U.S. PATENT DOCUMENTS

| | | | |
|---|---|---|---|
| 4,058,430 A | 11/1977 | Suntola et al. ............... 156/611 |
| 4,389,973 A | 6/1983 | Suntola et al. ............... 118/725 |
| 4,413,022 A | 11/1983 | Suntola et al. ........... 427/255.2 |
| 4,486,487 A | 12/1984 | Skarp ......................... 428/216 |
| 4,617,087 A * | 10/1986 | Iyer et al. |
| 4,767,494 A | 8/1988 | Kobayashi et al. .......... 156/606 |
| 4,806,321 A | 2/1989 | Nishizawa et al. .......... 422/245 |
| 4,813,846 A | 3/1989 | Helms ..................... 414/744.1 |
| 4,829,022 A | 5/1989 | Kobayashi et al. .......... 437/107 |
| 4,834,831 A | 5/1989 | Nishizawa et al. .......... 156/611 |
| 4,838,983 A | 6/1989 | Schumaker et al. ......... 156/613 |
| 4,838,993 A | 6/1989 | Aoki et al. .................. 156/643 |
| 4,840,921 A | 6/1989 | Matsumoto ................... 437/89 |
| 4,845,049 A | 7/1989 | Sunakawa ..................... 437/81 |
| 4,859,307 A | 8/1989 | Nishizawa et al. ............ 437/81 |
| 4,859,627 A | 8/1989 | Sunakawa ..................... 437/81 |
| 4,861,417 A | 8/1989 | Mochizuki et al. .......... 156/610 |
| 4,876,218 A | 10/1989 | Pessa et al. ................. 437/107 |
| 4,917,556 A | 4/1990 | Stark et al. ................. 414/217 |
| 4,927,670 A | 5/1990 | Erbil ........................ 427/255.3 |
| 4,931,132 A | 6/1990 | Aspnes et al. ............... 156/601 |
| 4,951,601 A | 8/1990 | Maydan et al. ............... 118/719 |
| 4,960,720 A | 10/1990 | Shimbo ....................... 437/105 |
| 4,975,252 A | 12/1990 | Nishizawa et al. .......... 422/245 |
| 4,993,357 A | 2/1991 | Scholz ........................ 118/715 |
| 5,000,113 A | 3/1991 | Wang et al. .................. 118/723 |
| 5,013,683 A | 5/1991 | Petroff et al. ............... 437/110 |
| 5,028,565 A | 7/1991 | Chang et al. ................. 437/192 |
| 5,037,775 A * | 8/1991 | Reisman ........................ 437/89 |
| 5,082,798 A | 1/1992 | Arimoto ...................... 437/108 |
| 5,085,885 A | 2/1992 | Foley et al. .................... 477/38 |
| 5,091,320 A | 2/1992 | Aspnes et al. ................... 437/8 |
| 5,130,269 A | 7/1992 | Kitahara et al. ............. 437/111 |
| 5,166,092 A | 11/1992 | Mochizuki et al. .......... 437/105 |
| 5,173,474 A | 12/1992 | Connell et al. ................. 505/1 |
| 5,186,718 A | 2/1993 | Tepman et al. ............. 29/25.01 |
| 5,205,077 A | 4/1993 | Wittstock ................. 51/165 R |
| 5,225,366 A | 7/1993 | Yoder ......................... 437/108 |
| 5,234,561 A | 8/1993 | Randhawa et al. .... 204/192.38 |
| 5,246,536 A | 9/1993 | Nishizawa et al. .......... 156/610 |
| 5,250,148 A | 10/1993 | Nishizawa et al. .......... 156/611 |
| 5,254,207 A | 10/1993 | Nishizawa et al. .......... 156/601 |
| 5,256,244 A | 10/1993 | Ackerman ................... 156/613 |
| 5,259,881 A | 11/1993 | Edwards et al. ............. 118/719 |
| 5,270,247 A | 12/1993 | Sakuma et al. .............. 437/133 |
| 5,278,435 A | 1/1994 | Van Hove et al. ........... 257/184 |
| 5,281,274 A | 1/1994 | Yoder ......................... 118/697 |
| 5,286,296 A | 2/1994 | Sato et al. .................. 118/719 |
| 5,290,748 A | 3/1994 | Knuuttila et al. ............. 502/228 |
| 5,294,286 A | 3/1994 | Nishizawa et al. .......... 156/610 |
| 5,296,403 A | 3/1994 | Nishizawa et al. .......... 437/133 |
| 5,300,186 A | 4/1994 | Kitahara et al. ............. 156/613 |
| 5,306,666 A | 4/1994 | Izumi .......................... 437/192 |
| 5,311,055 A | 5/1994 | Goodman et al. ........... 257/593 |
| 5,316,615 A | 5/1994 | Copel ........................... 117/95 |
| 5,316,793 A | 5/1994 | Wallace et al. ........... 427/248.1 |
| 5,330,610 A | 7/1994 | Eres et al. ..................... 117/86 |
| 5,336,324 A | 8/1994 | Stall et al. .................. 118/719 |
| 5,338,389 A | 8/1994 | Nishizawa et al. ............ 117/89 |
| 5,348,911 A | 9/1994 | Jurgensen et al. ............. 117/91 |
| 5,374,570 A | 12/1994 | Nasu et al. .................... 437/40 |
| 5,395,791 A | 3/1995 | Cheng et al. ................. 437/105 |
| 5,438,952 A | 8/1995 | Otsuka ......................... 117/84 |
| 5,439,876 A | 8/1995 | Graf et al. ................... 505/447 |
| 5,441,703 A | 8/1995 | Jurgensen ................... 422/129 |
| 5,443,033 A | 8/1995 | Nishizawa et al. ............ 117/86 |
| 5,443,647 A | 8/1995 | Aucoin et al. ........ 118/723 ME |
| 5,455,072 A | 10/1995 | Bension et al. ............ 427/255.7 |
| 5,458,084 A | 10/1995 | Thorne et al. ................. 117/89 |
| 5,469,806 A | 11/1995 | Mochizuki et al. ............ 117/97 |
| 5,480,818 A | 1/1996 | Matsumoto et al. ........... 437/40 |
| 5,483,919 A | 1/1996 | Yokoyama et al. ............ 117/89 |
| 5,484,664 A | 1/1996 | Kitahara et al. ............. 428/641 |
| 5,503,875 A | 4/1996 | Imai et al. ................. 427/255.3 |
| 5,521,126 A | 5/1996 | Okamura et al. ............. 437/235 |
| 5,527,733 A | 6/1996 | Nishizawa et al. .......... 437/160 |
| 5,532,511 A | 7/1996 | Nishizawa et al. .......... 257/627 |
| 5,540,783 A | 7/1996 | Eres et al. ................... 118/725 |
| 5,580,380 A | 12/1996 | Liu et al. ....................... 117/86 |
| 5,601,651 A | 2/1997 | Watabe ....................... 118/715 |
| 5,609,689 A | 3/1997 | Kato et al. .................. 118/719 |
| 5,616,181 A | 4/1997 | Yamamoto et al. ... 118/723 ER |
| 5,637,530 A | 6/1997 | Gaines et al. ................ 114/105 |
| 5,641,984 A | 6/1997 | Aftergut et al. ............. 257/433 |
| 5,644,128 A | 7/1997 | Wollnik et al. .............. 250/251 |
| 5,667,592 A | 9/1997 | Boitnott et al. .............. 118/719 |
| 5,674,786 A | 10/1997 | Turner et al. ................ 437/225 |
| 5,693,139 A | 12/1997 | Nishizawa et al. ............ 117/89 |
| 5,695,564 A | 12/1997 | Imahashi .................... 118/719 |
| 5,705,224 A | 1/1998 | Murota et al. ............ 427/248.1 |
| 5,707,880 A | 1/1998 | Aftergut et al. ................ 437/3 |
| 5,711,811 A | 1/1998 | Suntola et al. ............... 118/711 |
| 5,730,801 A | 3/1998 | Tepman et al. .............. 118/719 |
| 5,730,802 A | 3/1998 | Ishizumi et al. ............. 118/719 |
| 5,747,113 A | 5/1998 | Tsai ........................ 427/255.5 |
| 5,749,974 A | 5/1998 | Habuka et al. ............... 118/725 |
| 5,788,447 A | 8/1998 | Yonemitsu et al. .......... 414/217 |
| 5,788,799 A | 8/1998 | Steger et al. ................. 156/345 |
| 5,796,116 A | 8/1998 | Nakata et al. .................. 257/66 |
| 5,801,634 A | 9/1998 | Young et al. ................. 340/635 |
| 5,807,792 A | 9/1998 | Ilg et al. ..................... 438/758 |
| 5,830,270 A | 11/1998 | McKee et al. ............... 117/106 |
| 5,834,372 A | 11/1998 | Lee |
| 5,835,677 A | 11/1998 | Li et al. ..................... 392/401 |
| 5,851,849 A | 12/1998 | Comizzoli et al. ............. 438/38 |
| 5,855,675 A | 1/1999 | Doering et al. .............. 118/719 |
| 5,855,680 A | 1/1999 | Soininen et al. ............. 118/719 |
| 5,856,219 A | 1/1999 | Naito et al. .................. 438/241 |
| 5,858,102 A | 1/1999 | Tsai .......................... 118/719 |
| 5,866,213 A | 2/1999 | Foster et al. ................. 427/573 |
| 5,866,795 A | 2/1999 | Wang et al. ................... 73/1.36 |
| 5,879,459 A | 3/1999 | Gadgil et al. ................ 118/715 |
| 5,882,165 A | 3/1999 | Maydan et al. .............. 414/217 |
| 5,882,413 A | 3/1999 | Beaulieu et al. ............. 118/719 |
| 5,904,565 A | 5/1999 | Nguyen et al. .............. 438/687 |
| 5,916,365 A | 6/1999 | Sherman ....................... 117/92 |
| 5,923,056 A | 7/1999 | Lee et al. .................... 257/192 |
| 5,923,985 A | 7/1999 | Aoki et al. .................. 438/301 |
| 5,925,574 A | 7/1999 | Aoki et al. .................... 437/31 |
| 5,928,389 A | 7/1999 | Jevtic ........................ 29/25.01 |
| 5,942,040 A | 8/1999 | Kim et al. ................... 118/726 |
| 5,947,710 A | 9/1999 | Cooper et al. ................. 418/63 |
| 5,972,430 A | 10/1999 | DiMeo, Jr. et al. ...... 427/255.32 |
| 5,994,775 A | 11/1999 | Zhao et al. .................. 257/751 |
| 6,001,669 A | 12/1999 | Gaines et al. ................ 438/102 |
| 6,015,590 A | 1/2000 | Suntola et al. .......... 427/255.23 |
| 6,025,627 A | 2/2000 | Forbes et al. ................ 257/321 |
| 6,036,773 A | 3/2000 | Wang et al. ................... 117/97 |
| 6,042,652 A | 3/2000 | Hyun et al. .................. 118/719 |
| 6,043,177 A | 3/2000 | Falconer et al. ................ 502/4 |
| 6,051,286 A | 4/2000 | Zhao et al. .................. 427/576 |
| 6,062,798 A | 5/2000 | Muka .......................... 414/416 |
| 6,071,808 A | 6/2000 | Merchant et al. ............ 438/633 |
| 6,084,302 A | 7/2000 | Sandhu ....................... 257/751 |
| 6,086,677 A | 7/2000 | Umotoy et al. .............. 118/715 |
| 6,099,904 A | 8/2000 | Mak et al. |
| 6,110,556 A | 8/2000 | Bang et al. ................. 428/64.1 |
| 6,113,699 A * | 9/2000 | Hansen ....................... 115/715 |
| 6,113,977 A | 9/2000 | Soininen et al. ............... 427/64 |
| 6,117,244 A | 9/2000 | Bang et al. .................. 118/715 |
| 6,124,158 A | 9/2000 | Dautartas et al. ............ 438/216 |
| 6,130,147 A | 10/2000 | Major et al. ................. 438/604 |
| 6,139,700 A | 10/2000 | Kang et al. .............. 204/192.17 |
| 6,140,237 A | 10/2000 | Chan et al. .................. 438/687 |

| | | | | | | | |
|---|---|---|---|---|---|---|---|
| 6,140,238 | A | 10/2000 | Kitch ........................ 438/687 | EP | 0 799 641 A2 | 10/1997 | |
| 6,143,659 | A | 11/2000 | Leem ........................ 438/688 | FR | 2 626 110 | 7/1989 | |
| 6,144,060 | A | 11/2000 | Park et al. .................. 257/310 | FR | 2 692 597 | 12/1993 | |
| 6,156,382 | A | 12/2000 | Rajagopalan et al. | GB | 2 355 727 A | 5/2001 | |
| 6,158,446 | A | 12/2000 | Mohindra et al. ........ 134/25.4 | JP | 58-098917 | 6/1983 | |
| 6,174,377 | B1 | 1/2001 | Doering et al. ............ 118/729 | JP | 58-100419 | 6/1983 | |
| 6,174,809 | B1 | 1/2001 | Kang et al. ................. 438/682 | JP | 60-065712 A | 4/1985 | |
| 6,200,893 | B1 | 3/2001 | Sneh ........................ 438/685 | JP | 61-035847 | 2/1986 | |
| 6,203,613 | B1 | 3/2001 | Gates et al. ................ 117/104 | JP | 61-210623 | 9/1986 | |
| 6,206,967 | B1 | 3/2001 | Mak et al. ................. 118/666 | JP | 6 203 3768 | 2/1987 | |
| 6,207,302 | B1 | 3/2001 | Sugiura et al. ............ 428/690 | JP | 62-069508 | 3/1987 | |
| 6,248,605 | B1 | 6/2001 | Harkonen et al. ........... 438/29 | JP | 62-091495 A | 4/1987 | |
| 6,270,572 | B1 | 8/2001 | Kim et al. .................... 117/93 | JP | 62-141717 | 6/1987 | |
| 6,271,148 | B1 | 8/2001 | Kao et al. ................... 438/727 | JP | 62-167297 | 7/1987 | |
| 6,284,646 | B1 | 9/2001 | Leem ........................ 438/629 | JP | 62-171999 | 7/1987 | |
| 6,287,965 | B1 | 9/2001 | Kang et al. ................. 438/648 | JP | 62-232919 | 10/1987 | |
| 6,291,876 | B1 | 9/2001 | Stumborg et al. .......... 257/632 | JP | 63-062313 | 3/1988 | |
| 6,305,314 | B1 | 10/2001 | Sneh et al. ............. 118/723 R | JP | 63-085098 | 4/1988 | |
| 6,306,216 | B1 | 10/2001 | Kim et al. .................. 118/725 | JP | 63-090833 | 4/1988 | |
| 6,316,098 | B1 | 11/2001 | Yitzchaik et al. ........... 428/339 | JP | 63-222420 | 9/1988 | |
| 6,333,260 | B1 | 12/2001 | Kwon et al. ................ 438/643 | JP | 63-222421 | 9/1988 | |
| 6,355,561 | B1 | 3/2002 | Sandhu et al. .............. 438/676 | JP | 63-227007 | 9/1988 | |
| 6,358,829 | B2 | 3/2002 | Yoon et al. ................. 438/597 | JP | 63-252420 | 10/1988 | |
| 6,368,954 | B1 | 4/2002 | Lopatin et al. ............. 438/627 | JP | 63-266814 | 11/1988 | |
| 6,369,430 | B1 | 4/2002 | Adetutu et al. ............. 257/382 | JP | 64-009895 | 1/1989 | |
| 6,391,785 | B1 | 5/2002 | Satta et al. ................. 438/704 | JP | 64-009896 | 1/1989 | |
| 6,420,189 | B1 | 7/2002 | Lopatin ........................ 438/2 | JP | 64-009897 | 1/1989 | |
| 6,423,619 | B1 | 7/2002 | Grant et al. ................. 438/589 | JP | 64-037832 | 2/1989 | |
| 6,447,933 | B1 | 9/2002 | Wang et al. ................. 428/635 | JP | 64-082615 | 3/1989 | |
| 6,451,119 | B2 | 9/2002 | Sneh et al. ................. 118/715 | JP | 64-082617 | 3/1989 | |
| 6,451,695 | B2 | 9/2002 | Sneh ........................ 438/685 | JP | 64-082671 | 3/1989 | |
| 6,475,276 | B1 | 11/2002 | Elers et al. .................... 117/84 | JP | 64-082676 | 3/1989 | |
| 6,475,910 | B1 | 11/2002 | Sneh ........................ 438/685 | JP | 01-103982 | 4/1989 | |
| 6,482,733 | B2 | 11/2002 | Raaijmakers et al. ....... 438/633 | JP | 01-103996 | 4/1989 | |
| 6,482,740 | B2 | 11/2002 | Soininen et al. ............ 438/686 | JP | 64-090524 | 4/1989 | |
| 6,551,929 | B1* | 4/2003 | Kori et al. .................. 438/685 | JP | 01-117017 | 5/1989 | |
| 6,635,965 | B1* | 10/2003 | Lee et al. ................... 438/685 | JP | 01-143221 | 6/1989 | |
| 2001/0000866 | A1 | 5/2001 | Sneh et al. ............. 118/723 R | JP | 01-143233 | 6/1989 | |
| 2001/0002280 | A1 | 5/2001 | Sneh ........................ 427/255.28 | JP | 01-154511 | 6/1989 | |
| 2001/0009140 | A1 | 7/2001 | Bondestam et al. ........ 118/725 | JP | 01-236657 | 9/1989 | |
| 2001/0009695 | A1 | 7/2001 | Saanila et al. ............ 427/255.39 | JP | 01-245512 | 9/1989 | |
| 2001/0011526 | A1 | 8/2001 | Doering et al. ............ 118/729 | JP | 01-264218 | 10/1989 | |
| 2001/0024387 | A1 | 9/2001 | Raaijmakers et al. ....... 365/200 | JP | 01-270593 | 10/1989 | |
| 2001/0029094 | A1 | 10/2001 | Mee-Young et al. ....... 438/597 | JP | 01-272108 | 10/1989 | |
| 2001/0031562 | A1 | 10/2001 | Raaijmakers et al. ....... 438/770 | JP | 01-290221 | 11/1989 | |
| 2001/0034123 | A1 | 10/2001 | Jeon et al. ................. 438/643 | JP | 01-290222 | 11/1989 | |
| 2001/0041250 | A1 | 11/2001 | Werkhoven et al. ........ 428/212 | JP | 01-296673 | 11/1989 | |
| 2001/0054769 | A1 | 12/2001 | Raaijmakers et al. ....... 257/758 | JP | 01-303770 | 12/1989 | |
| 2002/0004293 | A1 | 1/2002 | Soininen et al. ............ 438/584 | JP | 01-305894 | 12/1989 | |
| 2002/0019121 | A1 | 2/2002 | Pyo ............................ 438/618 | JP | 01-313927 | 12/1989 | |
| 2002/0031618 | A1 | 3/2002 | Sherman .................... 427/569 | JP | 02-012814 | 1/1990 | |
| 2002/0037630 | A1 | 3/2002 | Agarwal et al. ............ 438/430 | JP | 02-014513 | 1/1990 | |
| 2002/0048880 | A1 | 4/2002 | Lee ............................ 438/253 | JP | 02-017634 | 1/1990 | |
| 2002/0055235 | A1 | 5/2002 | Agarwal et al. ............ 438/430 | JP | 02-063115 | 3/1990 | |
| 2002/0061612 | A1 | 5/2002 | Sandhu et al. .............. 438/151 | JP | 02-074029 | 3/1990 | |
| 2002/0076507 | A1 | 6/2002 | Chiang et al. .............. 427/569 | JP | 02-074587 | 3/1990 | |
| 2002/0086507 | A1 | 7/2002 | Park et al. .................. 438/585 | JP | 02-106822 | 4/1990 | |
| 2002/0090829 | A1 | 7/2002 | Sandhu et al. .............. 438/761 | JP | 02-129913 | 5/1990 | |
| 2002/0105088 | A1 | 8/2002 | Yang et al. ................. 257/774 | JP | 02-162717 | 6/1990 | |
| 2002/0106846 | A1 | 8/2002 | Seutter et al. .............. 438/200 | JP | 02-172895 | 7/1990 | |
| 2002/0109168 | A1 | 8/2002 | Kim et al. .................. 257/295 | JP | 02-196092 | 8/1990 | |
| 2002/0117399 | A1 | 8/2002 | Chen et al. ................. 205/125 | JP | 02-203517 | 8/1990 | |
| 2002/0121697 | A1 | 9/2002 | Marsh ........................ 257/751 | JP | 02-230690 | 9/1990 | |
| 2002/0155722 | A1 | 10/2002 | Satta et al. ................. 438/704 | JP | 02-230722 | 9/1990 | |
| 2002/0162506 | A1 | 11/2002 | Sneh et al. ................. 118/715 | JP | 02-246161 | 10/1990 | |
| | | | | JP | 02-264491 | 10/1990 | |
| | | | FOREIGN PATENT DOCUMENTS | JP | 02-283084 | 11/1990 | |
| | | | | JP | 02-304916 | 12/1990 | |
| DE | | 198 20 147 | 7/1999 | JP | 03-019211 | 1/1991 | |
| EP | | 0 344 352 A1 | 12/1989 | JP | 03-022569 | 1/1991 | |
| EP | | 0 429 270 A2 | 5/1991 | JP | 03-023294 | 1/1991 | |
| EP | | 0 442 490 A1 | 8/1991 | JP | 03-023299 | 1/1991 | |
| EP | | 0 704 551 A1 | 3/1996 | JP | 03-044967 | 2/1991 | |

| | | |
|---|---|---|
| JP | 03-048421 | 3/1991 |
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 03-286531 | 12/1991 |
| JP | 0 406 4223 | 2/1992 |
| JP | 04-031391 | 2/1992 |
| JP | 04-031396 | 2/1992 |
| JP | 04-031396 A | 2/1992 |
| JP | 04-100292 | 4/1992 |
| JP | 04-111418 | 4/1992 |
| JP | 04-132214 | 5/1992 |
| JP | 04-132681 | 5/1992 |
| JP | 04/151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04-260696 | 9/1992 |
| JP | 04-273120 | 9/1992 |
| JP | 04-285167 | 10/1992 |
| JP | 04-291916 | 10/1992 |
| JP | 04-325500 | 11/1992 |
| JP | 04-328874 | 11/1992 |
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 1 033 5264 | 12/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-319772 | 3/2000 |
| JP | 2000-138094 | 5/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | 90/02216 | 3/1990 |
| WO | 91/10510 A1 | 7/1991 |
| WO | 93/02111 A1 | 2/1993 |
| WO | 96/17107 A1 | 6/1996 |
| WO | 96/18756 A1 | 6/1996 |
| WO | 98/06889 | 2/1998 |
| WO | 98/51838 | 11/1998 |
| WO | 99/01595 | 1/1999 |
| WO | 99/13504 | 3/1999 |
| WO | 99/29924 A1 | 6/1999 |
| WO | 99/41423 A2 | 8/1999 |
| WO | 00/11721 | 3/2000 |
| WO | 00/15865 A1 | 3/2000 |
| WO | 00/15881 A2 | 3/2000 |
| WO | 00/16377 A2 | 3/2000 |
| WO | 00/54320 A1 | 9/2000 |
| WO | 00/63957 A1 | 10/2000 |
| WO | 00/79019 A1 | 12/2000 |
| WO | 00/79576 A1 | 12/2000 |
| WO | 01/15220 | 3/2001 |
| WO | 01/15220 A1 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/40541 A1 | 6/2001 |
| WO | 01/66832 A2 | 9/2001 |
| WO | WO/02/46489 | 6/2002 |

OTHER PUBLICATIONS

Sone, et al., "Formation of Low Pressure Chemically Vapour Deposited W Thin Film on Silicon Dioxide for Gate Electrode Application," Thin Solid Films 253 (1994) 377-381.

International Search Report, dated Nov. 25, 2002 for PCT/US02/22486.

Lee, "The Preparation of Titanium-Based Thin Film by CVD Using Titanium Chlorides as Precursors", *Chemical Vapor Deposition,* 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/H2 Process", *J. Electrochem. Soc.* ,145(8) (Aug. 1998), pp. 2926-2931.

Min, et al., "Chemical Vapor Deposition of Ti—Si—N Films with Alternating Source Supply", *Mat., Res. Soc. Symp. Proc.,* vol. 564 (Apr. 5, 1999), pp. 207-210.

Bedair, "Atomic layer eptiaxy deposition processes", *J. Vac. Sci. Technol.* 12(1) (Jan./Feb. 1994).

Yamaga, et al., "Atomic layer epitaxy of ZnS by a new gas supplying system in a low-pressure metalorganic vapor phase epitaxy", *J. of Crystal Growth* 117 (1992), pp. 152-155.

Elam, et al., "Nucleation and growth during tungsten atomic layer deposition on SiO2 surfaces," Thin Solid Films 386 (2001) pp. 41-52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

Scheper, et al., "Low-temperature deposition of titanium nitride films from dialkylhydrazine-based precursors", Materials Science in Semiconductor Processing 2 (1999), pp. 149-157.

Suzuki, et al., "A 0.2-μm contact filing by 450° C-hydrazine-reduced TiN film with low resistivity", IEDM 92-979, pp. 11.8.1-11.8.3.

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

McGeachin, S., "Synthesis and properties of some β-diketimines derived from acetylacetone, and their metal complexes", Canadian J. of Chemistry, vol. 46 (1968), pp. 1903-1912.

Solanki, et al., "Atomic Layer deposition of Copper Seed Layers", Electrochemical and Solid State Letters, 3(10) (2000), pp. 479-480.

NERAC.com Retro Search: Atomic Layer Deposition of Copper, dated Oct. 11, 2001.

NERAC.com Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149-154.

Choi, et al., "The effect of annealing on resistivity of low pressure chemical vapor depositied titanium diboride", J. Appl. Phys. 69(11) (Jun. 1, 1991), pp. 7853-7861.

Choi, et al., "Stability of $TiB_2$ as a Diffusion Barrier on Silicon", J. Electrochem. Soc. 138(10) (Oct. 1991), pp. 3062-3067.

"Cluster Tools for Fabrication of Advanced devices" Jap. J. of Applied Physics, Extended Abstracts, 22nd Conference Solid State Devices and Materials (1990), pp. 849-852.

"Applications of Integrated processing", Solid State Technology, US, Cowan Pub., vol. 37, No. 12 (Dec. 1, 1994), pp. 45-47.

Kitigawa, et al., "Hydrogen-mediated low temperature epitaxy of Si in plasma-enhanced chemical vapor deposition", Applied Surface Science (2000), pp. 30-34.

Lee, et al., "Pulsed nucleation for ultra-high aspect ratio tungsten plugfill", Novellus Systems, Inc. (2001), pp. 1-2 (*Copy Not Available to Applicant at This Time*).

Hultman, et al., "Review of the thermal and mechanical stability of TiN-based thin films", Zeitschrift Fur Metallkunde, 90(10) (Oct. 1999), pp. 803-813.

Klaus, et al., "Atomic Layer Deposition of $SiO_2$ Using Catalyzed and Uncatalyzed Self-Limiting Surface Reactions", *Surface Review & Letters*, 6(3&4) (1999), pp. 435-448.

Yamaguchi, et al., "Atomic-layer chemical-vapor-deposition of silicon dioxide films with extremely low hydrogen content", *Appl. Surf. Sci.*, vol. 130-132 (1998), pp. 202-207.

George, et al., "Surface Chemistry for Atomic Layer Growth", *J. Phys. Chem.*, vol. 100 (1996), pp. 13121-13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460-467.

Wise, et al., "Diethyldiethoxysilane as a new precursor for $SiO_2$ growth on silicon", *Mat. Res. Soc. Symp. Proc.*, vol. 334 (1994), pp. 37-43.

Niinisto, et al., "Synthesis of oxide thin films and overlayers by atomic layer epitaxy for advanced applications", *Mat. Sci. & Eng.*, vol. B41 (1996), pp. 23-29.

Ritala, et al., "Perfectly conformal TiN and $Al_2O_3$ films deposited by atomic layer deposition", *Chemical Vapor Deposition*, vol. 5(1) (Jan. 1999), pp. 7-9.

Klaus, et al., "Atomically controlled growth of tungsten and tungsten nitride using sequential surface reactions". *Appl. Surf. Sci.*, vol. 162-163 (2000), pp. 479-491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13-16, 1998), pp. 337-342.

Klaus, et al., "Atomic Layer Deposition of Tungsten using Sequential Surface Chemistry with a Sacrificial Stripping Reaction," Thin Solid Films 360 (2000), pp. 145-153, (Accepted Nov. 16, 1999).

Min, et al., "Metal-Organic Atomic-Layer Deposition of Titanium-Silicon-Nitride Films", *Applied Physics Letters,* American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45-50.

Ritala, et al. "Atomic Layer Epitaxy Growth of TiN Thin Films", *J. Electrochem. Soc.*, 142(8) (Aug. 1995), pp. 2731-2737.

Elers, et al., "NbC15 as a precursor in atomic layer epitaxy", *Appl. Surf. Sci.*, vol. 82/83 (1994), pp. 468-474.

PCT International Search Report for PCT/US03/22477, dated Mar. 12, 2004.

* cited by examiner

PULSED NUCLEATION DEPOSITION OF TUNGSTEN LAYERS

CROSS-REFERENCE TO RELATED APPLICATIONS

The present application is a continuation-in-part of application Ser. No. 10/023,125, filed Dec. 17, 2001, entitled "Pulse Nucleation Enhanced Nucleation Technique For Improved Step Coverage and Better Gap Fill For WCVD Process," which in turn claims priority from U.S. provisional application No. 60/305,307, filed Jul. 13, 2001, entitled "Pulse Nucleation Enhanced Nucleation Technique For Improved Step Coverage and Better Gap Fill For WCVD Process." Each of these applications is incorporated herein by reference in its entirety.

BACKGROUND OF THE INVENTION

1. Field of the Invention

The present invention generally relates to a method of forming tungsten layers and, more particularly forming tungsten layers using a pulsed nucleation deposition process.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components as well as improved layer uniformity.

In particular, metal layers, such as those used for interconnect, contact, and plug fill applications, are subject to increasingly stringent requirements related to step coverage and layer uniformity. Tungsten layers, for example, are particularly difficult to deposit with uniform step coverage. Typically, tungsten layers are formed by chemical vapor deposition (CVD), using a two step process. A bulk tungsten layer is typically deposited by reacting tungsten hexafluoride ($WF_6$) with hydrogen ($H_2$) on a substrate. In order to reduce the time required to initiate the reaction between the tungsten hexafluoride ($WF_6$) and the hydrogen ($H_2$) (i.e., reduce the "incubation time"), a nucleation layer is typically deposited prior to depositing the bulk tungsten layer. Unfortunately, the nucleation layer, typically deposited by reacting tungsten hexafluoride ($WF_6$) with silane ($SiH_4$), has suboptimal step coverage. As a result, voids may form in the tungsten nucleation layer during deposition, adversely impacting the electrical performance of devices fabricated therefrom.

Therefore, a need exists in the art for a method of depositing a tungsten nucleation layer with improved step coverage.

SUMMARY OF THE INVENTION

Embodiments of the present invention generally relate to a method of forming a tungsten nucleation layer using a sequential deposition process. The tungsten nucleation layer is formed by reacting pulses of a tungsten-containing precursor and a reducing gas in a process chamber to deposit tungsten on the substrate. Thereafter, reaction by-products generated from the tungsten deposition are removed from the process chamber. After the reaction by-products are removed from the process chamber, a flow of the reducing gas is provided to the process chamber to react with residual tungsten-containing precursor remaining therein. Such a deposition process forms tungsten nucleation layers having good step coverage. The sequential deposition process of reacting pulses of the tungsten-containing precursor and the reducing gas, removing reaction by-products, and than providing a flow of the reducing gas to the process chamber may be repeated until a desired thickness for the tungsten nucleation layer is formed.

The formation of the tungsten nucleation layer is compatible with integrated circuit fabrication processes. In one integrated circuit fabrication process, the tungsten nucleation layer is formed prior to tungsten plug formation. For such an embodiment, a preferred process sequence includes depositing a tungsten nucleation layer in apertures defined in a dielectric material layer formed on a substrate. The tungsten nucleation layer is formed using a sequential deposition process in which pulses of a tungsten-containing precursor and a reducing gas are reacted, reaction by-products removed, and than a flow of reducing gas is provided to a process chamber. The sequential deposition process may be repeated until a desired thickness for the tungsten nucleation layer is deposited. Thereafter, the tungsten plug is completed when a bulk tungsten layer is deposited on the tungsten nucleation layer to fill the apertures.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
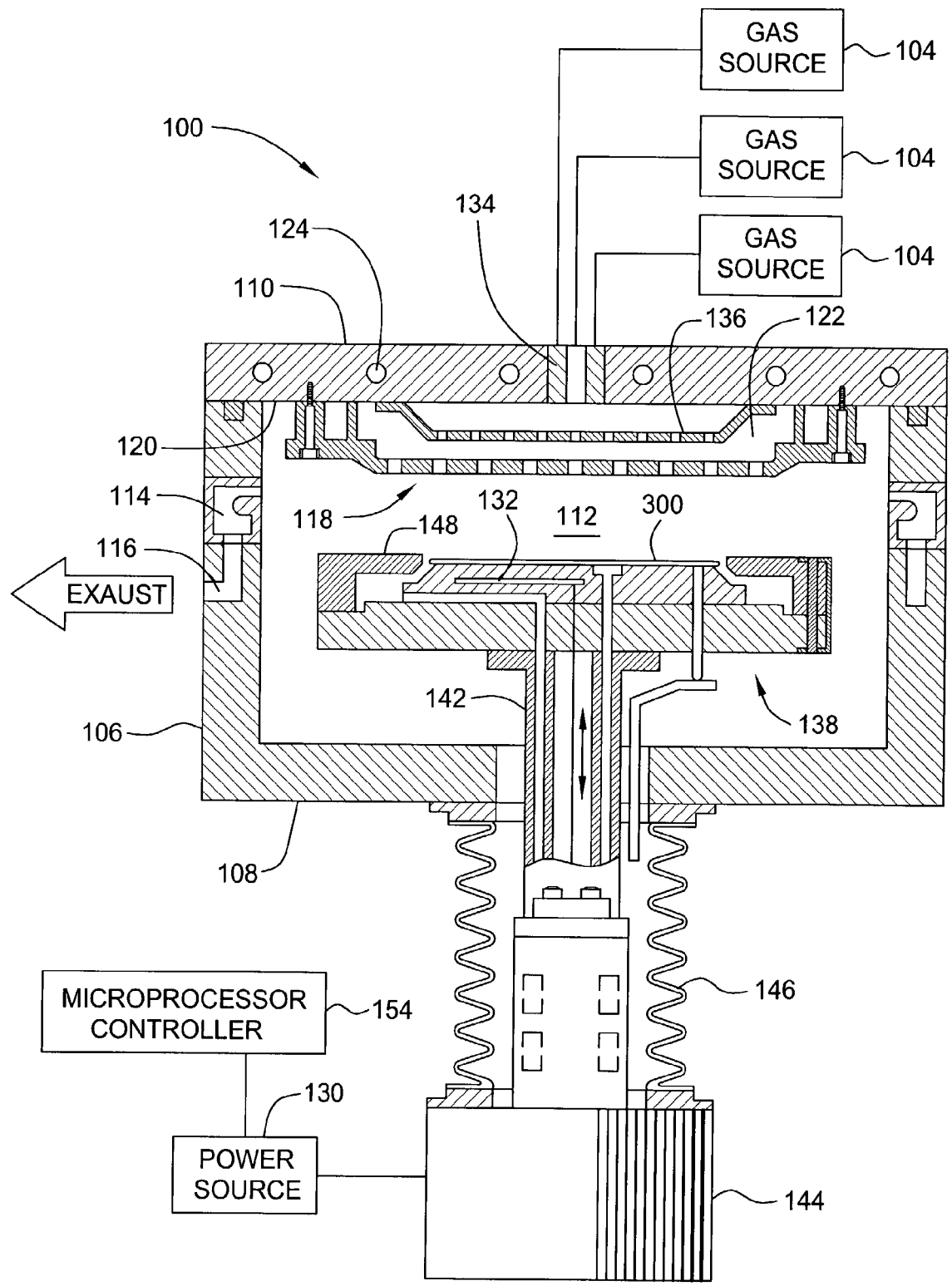
FIG. 1 is a schematic cross-sectional view of a processing chamber that may be used to practice embodiments described herein.

Embodiments described herein relate to a method for depositing a tungsten nucleation layer on a substrate. FIG. 1 depicts a schematic cross-sectional view of a chemical vapor deposition (CVD) process chamber 100 that may be used to practice embodiments of the invention described herein. The process chamber 100 may be part of a processing system (not shown) that includes multiple processing chambers connected to a central transfer chamber (not shown) and serviced by a robot (not shown).

The process chamber 100 includes walls 106, a bottom 108, and a lid 110 that define a process volume 112. The walls 106 and bottom 108 are typically fabricated from a unitary block of aluminum. The walls 106 may have conduits (not shown) therein through which a fluid may be passed to control the temperature of the walls 106. The process chamber 100 may also include a pumping ring 114 that couples the process volume 112 to an exhaust port 116 as well as other pumping components (not shown).

A heated support assembly 138 is centrally disposed within the process chamber 100. The support assembly 138 supports a substrate 300 during a deposition process. The support assembly 138 generally is fabricated from aluminum, ceramic or a combination of aluminum and ceramic and typically includes a vacuum port (not shown) and at least one or more heating elements 132.

The vacuum port may be used to apply a vacuum between the substrate 300 and the substrate support 138, so as to secure the substrate 300 to the substrate support 138 during the deposition process. The one or more heating elements 132, may be, for example, electrodes disposed in the substrate support 138, and coupled to a power source 130, to heat the substrate support 138 and substrate 300 positioned thereon to a predetermined temperature.

Generally, the support assembly 138 is coupled to a stem 142. The stem 142 provides a conduit for electrical leads, vacuum and gas supply lines between the support assembly 138 and other components of the process chamber 100. Additionally, the stem 142 couples the support assembly 138 to a lift system 144 that moves the support assembly 138 between an elevated position (as shown in FIG. 1) and a lowered position (not shown). Bellows 146 provide a vacuum seal between the chamber volume 112 and the atmosphere outside the chamber 102 while facilitating the movement of the support assembly 138.

The support assembly 138 additionally supports a circumscribing shadow ring 148. The shadow ring 148 is annular in form and typically comprises a ceramic material such as, for example, aluminum nitride. Generally, the shadow ring 148 prevents deposition at the edge of the substrate 300 and support assembly 138.

The lid 110 is supported by the walls 106 and may be removed to service the process chamber 100. The lid 110 is generally comprised of aluminum and may additionally have heat transfer fluid channels 124 formed therein. The heat transfer fluid channels 124 are coupled to a fluid source (not shown) that flows a heat transfer fluid through the lid 110. Fluid flowing through the channels 124 regulates the temperature of the lid 110.

A mixing block 134 is disposed in the lid 110. The mixing block 134 is coupled to gas sources 104. Generally, individual gas streams from the gas sources 104 are combined in the mixing block 134. These gases are mixed into a single homogeneous gas flow in the mixing block 134 and introduced into the process volume 112 after passing through a showerhead 118 that diffuses the gas flow outwardly towards the chamber walls 106.

The showerhead 118 is generally coupled to an interior side 120 of the lid 110. A perforated blocker plate 136 may optionally be disposed in the plenum 122 between the showerhead 118 and lid 110. Gases (i.e., process and other gases) that enter the chamber 102 through the mixing block 134 are first diffused by the blocker plate 136 as the gases fill the plenum 122 behind the showerhead 118. The gases then pass through the showerhead 118 and into the chamber 102. The blocker plate 136 and the showerhead 118 are configured to provide a uniform flow of gases to the process chamber 100. Uniform gas flow is desirable to promote uniform layer formation on the substrate 300.

The CVD process chamber 100 is controlled by a microprocessor controller 154. The microprocessor controller may be one of any form of general purpose computer processor (CPU) that can be used in an industrial setting for controlling various chambers and sub-processors. The computer processor may use any suitable memory, such as random access memory, read only memory, floppy disc drive, hard disk, or any other form of digital storage local or remote. Various support circuits may be coupled to the CPU for supporting the processor in a conventional manner. Software routines as required may be stored in the memory or executed by a second CPU that is remotely located.

The software routines are executed after the substrate is positioned on the substrate support. The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

TUNGSTEN NUCLEATION LAYER FORMATION

Figure 2:
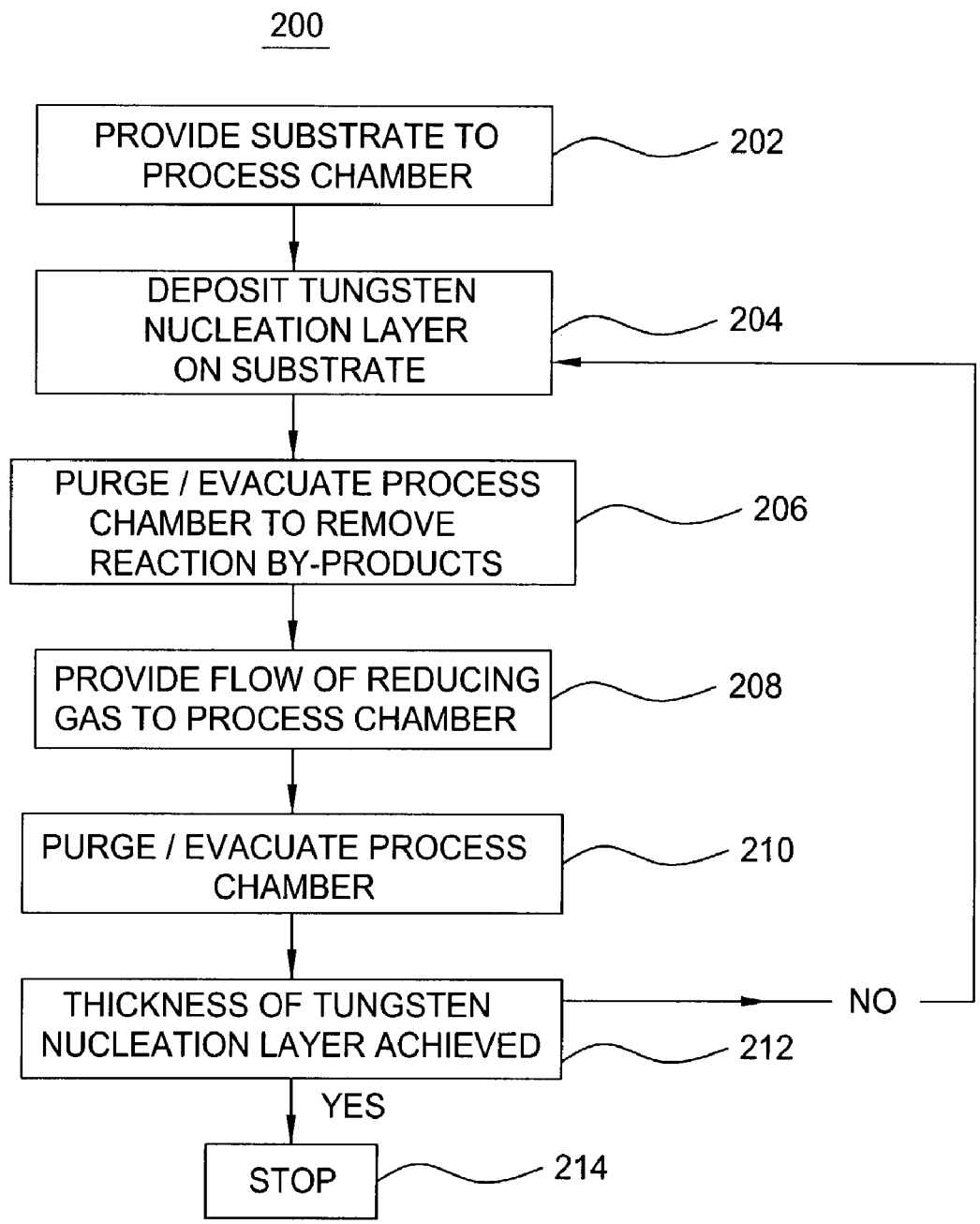
FIG. 2 illustrates a process sequence for tungsten nucleation layer formation using deposition techniques according to embodiments described herein.

FIG. 2 illustrates a process sequence 200 detailing the various steps used for the formation of a tungsten nucleation layer. These steps may be performed in a CVD process chamber similar to that described above with reference to FIG. 1. As shown in step 202, a substrate is provided to the CVD process chamber. The substrate may be, for example, a silicon substrate, which may or may not have one or more material layers disposed thereon. The one or more material layers, for example, may be an oxide layer having a sub-quarter micron aperture therein. Sub-quarter micron apertures typically have aspect ratios (e.g., the feature width divided by the feature length) greater than about 8:1.

The sub-quarter micron features may have a barrier layer formed therein. The barrier layer may be, for example, titanium nitride (TiN). The barrier layer generally serves to prevent diffusion of the tungsten into surrounding material layers and to enhance the adhesion of the tungsten layer.

In step 204, a tungsten nucleation layer is deposited on the substrate conformably in the sub-quarter micron features. The tungsten nucleation layer may be formed, for example, from a reaction of a tungsten-containing precursor such as, for example, tungsten hexafluoride ($WF_6$) with a reducing gas such as for example, silane ($SiH_4$), disilane ($Si_2H_6$), borane ($BH_3$) and diborane ($B_2H_6$), among others. In one embodiment, tungsten hexafluoride ($WF_6$) is reacted with silane ($SiH_4$). Helium (He) and argon (Ar), or other inert gases, may also be provided along with the reactant gases either singly or in combination.

Typically, the reaction may be performed at a tungsten hexafluoride ($WF_6$) flow rate of about 5 sccm (standard cubic centimeters per minute) to about 100 sccm and a silane ($SiH_4$) flow rate of about 1 sccm to about 100 sccm. The tungsten-containing precursor and the reducing gas may be provided to the process chamber in a tungsten-containing precursor to reducing gas ratio of about 1:1 to about 5:1. It is believed that such ratios for the tungsten-containing precursor and the reducing provide good step coverage for the tungsten nucleation layer. A total pressure of about 0.5 torr to about 100 torr and a pedestal temperature of about 200° C. to about 600° C. may be used.

The tungsten-containing precursor and the reducing gas may be flowed or pulsed into the process chamber for a time period of about 0.1 seconds to about 10 seconds, and preferably for about 1 second to about 3 seconds. The time period of reactant gas flow should be generally long enough to provide a sufficiently high deposition rate for the tungsten nucleation layer.

Referring to step 206, after the flow or pulse of the reactant gases has ceased, the process chamber is purged/pumped to remove reaction by-products generated during nucleation layer deposition. The production of these reaction by-products at or near the surface of the tungsten nucleation layer are believed to form a rough tungsten surface and contribute to non-conformality and poor step coverage during tungsten nucleation layer deposition. Removal of the reaction by-products using a purge/pump step may provide nucleation layers with improved step coverage.

The purge gas may be one or more gases selected from the group of argon (Ar), nitrogen ($N_2$), helium (He) neon (Ne) and xenon (Xe), among others. Typically, the process chamber is purged by providing thereto a purge gas at a flow rate of about 5 sccm to about 5000 sccm, for up to about 10 seconds.

Alternatively or in addition to introducing the purge gas, the process chamber may be depressurized in order to remove the residual reactant gases as well as any reaction by-products. The depressurization of the process chamber may result in the chamber pressure being reduced to a pressure in a range of about 0.01 torr to about 40 torr within a time period of about 0.5 seconds to about 20 seconds.

Depending upon the ratio of the tungsten-containing precursor to the reducing gas in the reactant gas mixture, as well as the removal time, excess tungsten-containing precursor may remain in the process chamber after the purge/pump step 206. Referring to step 208, after the purge/pump step is performed, a flow of the reducing gas may be provided to the process chamber. The flow of the reducing gas functions to react with excess tungsten-containing precursor that may be present near the surface of the nucleation layer, particularly in regions adjacent to the high aspect ration features after the purge/pump step 208.

The reducing gas may be provided to the process chamber as a pulse or flow for a time period within a range of about 0.1 seconds to about 10 seconds. In general, the time period should be long enough for the reducing gas to react with excess tungsten-containing precursor in the process chamber. Particularly for high aspect ratio features, it is believed that such flow of reducing gas may react with any excess tungsten-containing precursor in the vicinity of the feature improving the step coverage therefore and depositing tungsten in a void-free manner within such features.

Referring to step 210, after the flow or pulse of the reducing gas has ceased, the process chamber is purged/pumped to remove reaction by-product as well as residual gases remaining therein. The purge gas may be one or more gases selected from the group of argon (Ar), nitrogen ($N_2$), helium (He) neon (Ne) and xenon (Xe), among others. Typically, the process chamber is purged by providing thereto a purge gas at a flow rate of about 5 sccm to about 5000 sccm, for up to about 10 seconds.

Alternatively or in addition to introducing the purge gas, the process chamber may be depressurized in order to remove the residual reactant gases as well as any reaction by-products. The depressurization of the process chamber may result in the chamber pressure being reduced to a pressure in a range of about 0.01 torr to about 40 torr within a time period of about 0.5 seconds to about 20 seconds.

Referring to step 212, after purge/pump step 210, a total thickness of the tungsten nucleation layer will be formed on the substrate. Depending on specific device requirements, steps 204 through 210 may be repeated until a desired thickness for the tungsten nucleation layer is achieved. Thereafter, when the desired thickness for the tungsten nucleation layer is achieved the process is stopped as indicated by step 214.

The determination of the thickness of the tungsten nucleation layer may be performed using conventional processes such as, for example, spectroscopic measurements. Alternatively, the thickness of the nucleation layer may be estimated by performing a calculation based upon the deposition rate as determined using, for example, various process variables such as flow rates, temperature and pressure.

While steps 206 through 210 are depicted as three distinct steps in FIG. 2, steps 206 through 210 may take place simultaneously. For example, a purge gas may be provided to the process chamber simultaneously with the reducing gas to improve overall process throughput.

Additionally, process variables, such the temperature, pressure, gas flow rates, flow/pulse times, and the like, may be adjusted throughout the nucleation layer deposition process in order to optimize layer deposition rate. For example, early in the deposition process, a low ratio for the tungsten-containing precursor and reducing gas (e.g., ratio of about 1:1) may be used in step 204 in order to, for example, minimize the adverse effects of fluorine on underlying material layers. In subsequent deposition cylces, the ratio for the tungsten-containing precursor and reducing gas may be increased (e.g., ratio of 3:1).

Figure 3A:
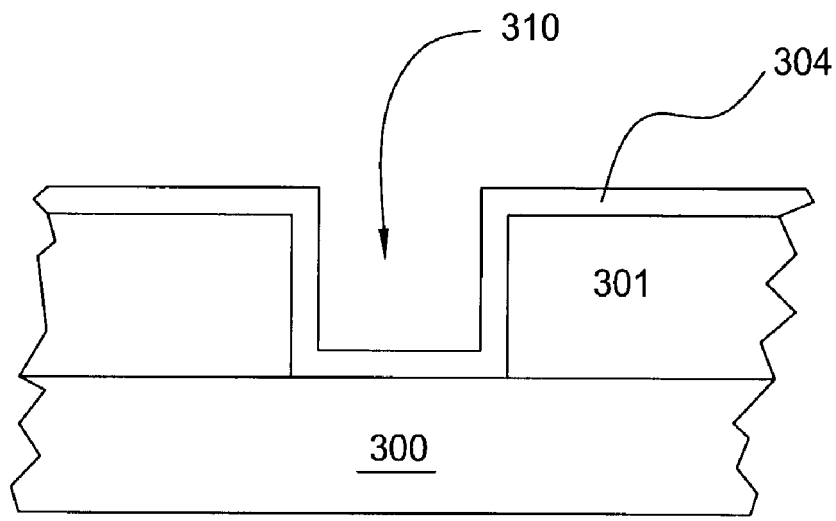
FIGS. 3A–3B depict cross-sectional views of a substrate at different stages of an integrated circuit fabrication sequence.
Figure 3B:
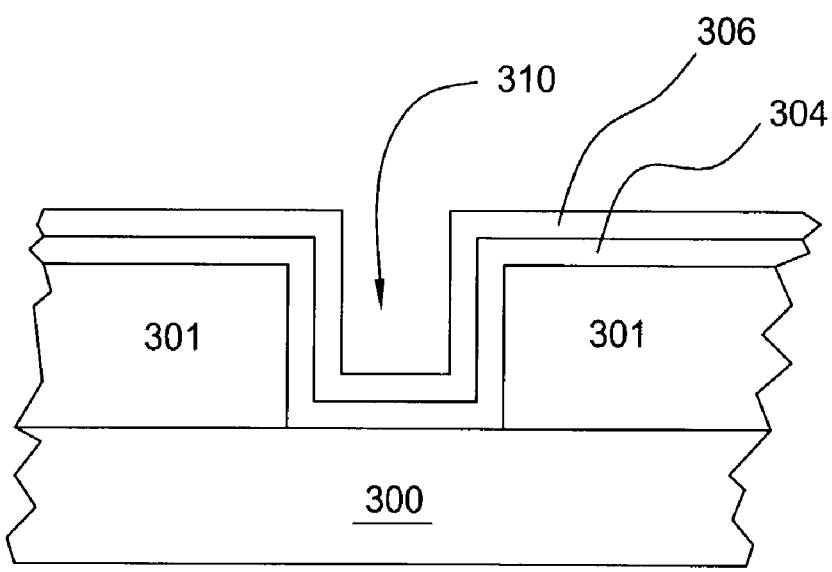

In an exemplary tungsten nucleation layer deposition process, a silicon substrate 300 having a feature 310 formed in a dielectric layer 301 was provided, as shown in FIG. 3A. The substrate 300 had a titanium nitride (TiN) barrier layer 304 conformably deposited on the feature 310. A tungsten nucleation layer 306 was formed on the titanium nitride (TiN) barrier layer within the feature 310, as shown in FIG. 3B. The tungsten nucleation layer was formed as described above with reference to FIG. 2.

Specifically, a gas mixture comprising tungsten hexafluoride ($WF_6$) and silane ($SiH_4$) was provided to the process chamber for a time period of about 1.5 seconds. The respective flow rates of the tungsten hexafluoride ($WF_6$) and silane ($SiH_4$) were about 30 sccm and about 10 sccm, respectively. An argon (Ar) carrier gas was provided to the chamber at a flow rate of about 1500 sccm along with tungsten hexafluoride ($WF_6$). A nitrogen ($N_2$) carrier gas was provided to the chamber at a flow rate of about 300 sccm along with the silane ($SiH_4$).

The gas mixture was removed from the process chamber by providing a pulse of argon (Ar) for a duration of about 2 seconds. Thereafter, a flow of silane ($SiH_4$) gas was provided to the chamber at a flow rate of about 20 sccm for about 1 second. A pulse of argon (Ar) was then provided for about 2 seconds in order purge the process chamber. This process sequence was repeated by providing the gas mixture, the argon purge, the flow of silane ($SiH_4$), and the argon purge until a thickness of about 250 Å for the tungsten nucleation layer was achieved. The resulting tungsten nucleation layer had a step coverage, as determined by transmission electron microscopy (TEM) of about 100%.

While the foregoing is directed to embodiments of the present invention, other and further embodiments of the invention may be devised without departing from the basic scope thereof, and the scope thereof is determined by the claims that follow.

The invention claimed is:

1. A method for depositing a tungsten nucleation layer on a substrate within a process chamber, comprising:
   (a) providing a flow of a gas mixture comprising a tungsten-containing precursor and a reducing gas into a process chamber to deposit a tungsten nucleation layer on a substrate;
   (b) removing reaction by-products generated during step (a) from the process chamber;

(c) providing a flow of the reducing gas into the process chamber to react with residual tungsten-containing precursor in the process chamber and deposit tungsten on the substrate;

(d) removing reaction by-products generated during step (c) from the process chamber; and (e) repeating steps (a)–(d).

2. The method of claim 1 further comprising repeating step (e) until a tungsten nucleation layer thickness of up to about 500 Å is deposited.

3. The method of claim 1 wherein the tungsten-containing precursor comprises tungsten hexafluoride.

4. The method of claim 1 wherein the reducing gas in steps (a) and (c) is selected from the group consisting of silane, disilane, borane, diborane, derivatives thereof and combinations thereof.

5. The method of claim 1 wherein the gas mixture of step (a) is provided for a time period of about 0.1 seconds to about 10 seconds.

6. The method of claim 1 wherein the tungsten-containing precursor and the reducing gas are provided in a tungsten-containing precursor:reducing gas ratio of about 1:1 to about 5:1.

7. The method of claim 1 wherein the reaction by-products in steps (b) and (d) are removed from the process chamber by providing a purge gas thereto and evacuating both the purge gas and the reaction by-products therefrom.

8. The method of claim 7 wherein the purge gas comprises on or more gases selected from the group consisting of nitrogen, helium, argon and combinations thereof.

9. The method of claim 7 wherein the purge gas is provided to the process chamber for up to about 10 seconds.

10. The method of claim 1 wherein the reducing gas of step (c) is provided to the process chamber for up to about 10 seconds.

11. The method of claim 1 wherein time periods for steps (b) and (c) overlap.

12. A method for depositing a tungsten nucleation layer on a substrate within a process chamber, comprising:

(a) providing a flow of a gas mixture comprising a tungsten-containing precursor and a reducing gas into a process chamber for about 0.1 seconds to about 10 seconds to deposit a tungsten nucleation layer on a substrate;

(b) removing reaction by-products generated during step (a) by providing a purge gas into the process chamber and evacuating both the purge gas and the reaction by-products therefrom;

(c) providing a flow of the reducing gas into the process chamber for up to about 10 seconds to react with residual tungsten-containing precursor in the process chamber and deposit tungsten on the substrate;

(d) removing reaction by-products generated during step (c) by providing a purge gas into the process chamber and evacuating both the purge gas and the reaction by-products therefrom; and (e) repeating steps (a)–(d) until a tungsten nucleation layer thickness of up to about 500 Å is deposited.

13. The method of claim 12 wherein the tungsten-containing precursor comprises tungsten hexafluoride.

14. The method of claim 12 wherein the reducing gas in steps (a) and (c) is selected from the group consisting of silane, disilane, borane, diborane, derivatives thereof and combinations thereof.

15. The method of claim 12 wherein the tungsten-containing precursor and the reducing gas are provided in a tungsten-containing precursor:reducing gas ratio of about 1:1 to about 5:1.

16. The method of claim 12 wherein the purge gas of steps (b) and (d) comprises one or more gases selected from the group consisting of nitrogen, helium, argon and combinations thereof.

17. The method of claim 12 wherein the purge gas of steps (b) and (d) is provided to the process chamber for up to about 10 seconds.

18. The method of claim 12 wherein time periods for steps (b) and (C) overlap.

19. A method for depositing a tungsten nucleation layer on a substrate within a process chamber, comprising:

(a) providing a flow of a gas mixture comprising tungsten hexafluoride and silane into a process chamber for about 0.1 seconds to about 10 seconds to deposit a tungsten nucleation layer on a substrate;

(b) removing reaction by-products generated during step (a) by providing a purge gas into the process chamber and evacuating both the purge gas and the reaction by-products therefrom;

(c) providing a flow of silane into the process chamber for up to about 10 seconds to react with residual tungsten hexafluoride in the process chamber and deposit tungsten on the substrate;

(d) removing reaction by-products generated during step (c) by providing a purge gas into the process chamber and evacuating both the purge gas and the reaction by-products therefrom; and (e) repeating steps (a)–(d) until a tungsten nucleation layer thickness of up to about 500 Å is deposited.

20. The method of claim 19 wherein the tungsten hexafluoride and the silane are provided in a tungsten hexafluoride:silane ratio of about 1:1 to about 5:1.

21. The method of claim 19 wherein the purge gas of steps (b) and (d) comprises one or more gases selected from the group consisting of nitrogen, helium, argon and combinations thereof.

22. The method of claim 19 wherein the purge gas of steps (b) and (d) is provided to the process chamber for up to about 10 seconds.

23. The method of claim 19 wherein time periods for steps (b) and (c) overlap.

24. A method for depositing a tungsten nucleation layer on a substrate within a process chamber, comprising:

exposing a substrate to a gas mixture containing a tungsten precursor and a reducing gas for depositing a tungsten nucleation layer for about 0.1 seconds to about 10 seconds within a process chamber during a deposition step;

exposing the process chamber to a first purge step that includes providing a purge gas into the process chamber and evacuating the process chamber;

exposing the substrate to diborane or silane during a soak step;

exposing the process chamber to a second purge step that includes providing the purge gas into the process chamber and evacuating the process chamber; and repeating the deposition step and the first purge step until the tungsten nucleation layer is formed with a predetermined thickness.

25. A method for depositing a tungsten nucleation layer on a substrate within a process chamber, comprising:

exposing a substrate to a gas mixture containing a tungsten precursor and a reducing gas for about 0.1 seconds to about 10 seconds within a process chamber during a deposition step;

exposing the process chamber to a purge step that includes providing a purge gas into the process chamber and evacuating the process chamber;

repeating the deposition step and the purge step until a tungsten nucleation layer is formed with a predetermined thickness; and depositing a tungsten bulk layer on the tungsten nucleation layer during a second vapor deposition process.

* * * * *